(12) United States Patent
Yamamori

(10) Patent No.: US 8,614,589 B2
(45) Date of Patent: Dec. 24, 2013

(54) METHOD OF FABRICATING SEMICONDUCTOR DEVICE

(75) Inventor: Yuta Yamamori, Minato-ku (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 400 days.

(21) Appl. No.: 13/050,487

(22) Filed: Mar. 17, 2011

(65) Prior Publication Data

US 2011/0244605 A1     Oct. 6, 2011

(30) Foreign Application Priority Data

Mar. 30, 2010    (JP) .................................. 2010-079829

(51) Int. Cl.
*G01R 31/3187* (2006.01)
*G01R 31/28* (2006.01)

(52) U.S. Cl.
CPC .................................. *G01R 31/2884* (2013.01)
USPC ............. 324/750.3; 257/777; 438/18; 438/14

(58) Field of Classification Search
None
See application file for complete search history.

(56) References Cited

U.S. PATENT DOCUMENTS

| | | | | |
|---|---|---|---|---|
| 5,059,899 A | * | 10/1991 | Farnworth et al. | ............... 438/18 |
| 6,118,138 A | * | 9/2000 | Farnworth et al. | ............... 257/48 |
| 6,137,303 A | * | 10/2000 | Deckert et al. | ........... 324/757.03 |
| 7,537,959 B2 | * | 5/2009 | Lee et al. | ....................... 438/106 |

FOREIGN PATENT DOCUMENTS

| | | |
|---|---|---|
| JP | 2007-35925 | 2/2007 |
| JP | 2010-232641 | 10/2010 |

* cited by examiner

*Primary Examiner* — Paresh Patel
(74) *Attorney, Agent, or Firm* — Oblon, Spivak, McClelland, Maier & Neustadt, L.L.P.

(57) ABSTRACT

According to one embodiment, a method of fabricating a semiconductor device, including forming semiconductor chips having a test circuit electrically connected to an input pad and an output pad, the input pad having a first pad located on a first principal surface and a second pad located on a second principal surface of the semiconductor wafer, placing the semiconductor wafers on an inspection apparatus, each input pad brought into contact with each input pad adjacent semiconductor wafer, bringing each of probing tips on the input pad of the semiconductor chips of an uppermost or lowermost semiconductor wafer in the semiconductor wafers and performing a test on the semiconductor chips in one batch.

14 Claims, 3 Drawing Sheets

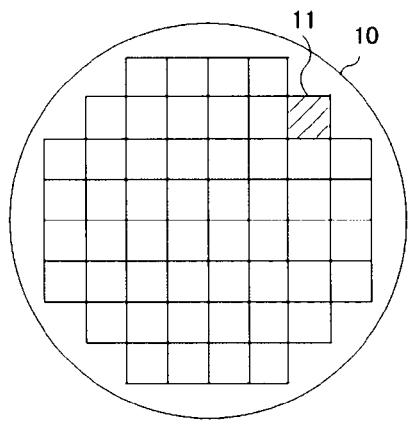
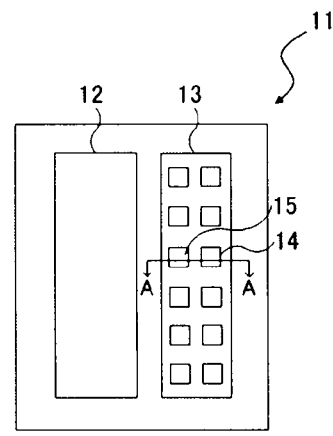
FIG.1A  FIG.1B
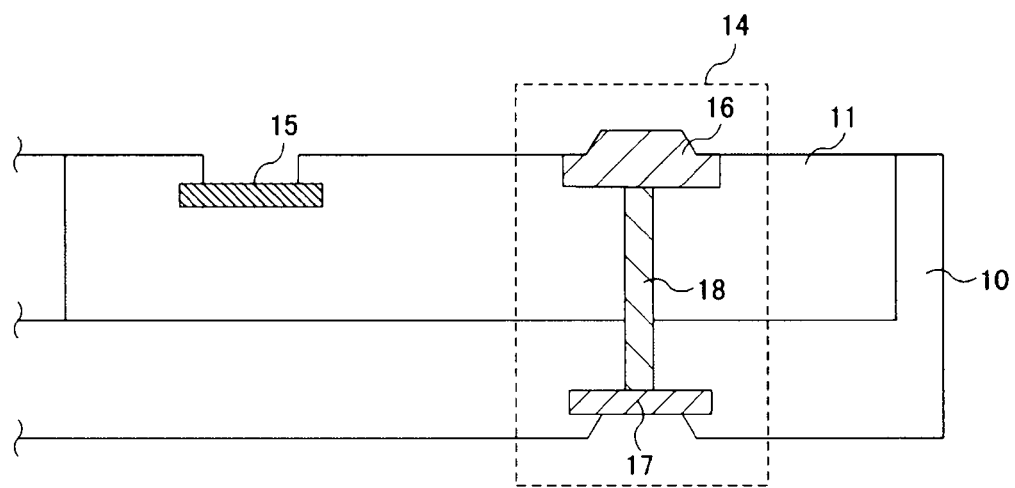
FIG. 2

METHOD OF FABRICATING SEMICONDUCTOR DEVICE

CROSS REFERENCE TO RELATED APPLICATION

This application is based upon and claims the benefit of priority from prior Japanese Patent Application No. 2010-079829, filed on Mar. 30, 2010, the entire contents of which are incorporated herein by reference.

FIELD

Embodiments described herein generally relate to a method of fabricating a semiconductor device and fabricating a semiconductor device, for example, to a method of testing a semiconductor chip.

BACKGROUND

Fabrication processes of semiconductor devices include a process of testing electrical characteristics of each of multiple semiconductor chips after the chips are formed on a semiconductor wafer.

Conventionally the semiconductor chips are tested sequentially one by one.

This method, however, requires too much time to test all the semiconductor chips in the semiconductor wafer.

Accordingly, in recent years, a testing method has been developed in which reduction of testing time is achieved by installing built-in-self-test (GIST) circuits in respective semiconductor chips formed on a semiconductor wafer.

However, with an increase in the number of semiconductor chips formed on a single semiconductor wafer and an increase in the number of test items due to an increased number of functionalities of semiconductor devices, it still takes much time to test the semiconductor chips. Hence, there are increasing demands for shortening the testing time.

BRIEF DESCRIPTION OF THE DRAWINGS

FIG. 1A is a plan view showing a semiconductor wafer according to an embodiment, and FIG. 1B is a plan view illustrating a general configuration of a semiconductor chip according to the embodiment.

FIG. 2 is a sectional view taken along the line A-A of FIG. 1B showing the semiconductor chip according to the embodiment.

DETAILED DESCRIPTION

Figure 3:
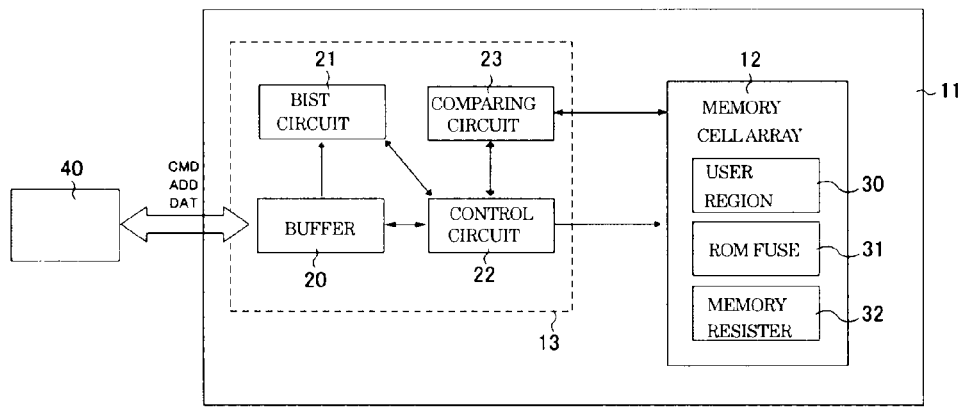
FIG. 3 is a block diagram showing the configuration of the semiconductor chip according to the embodiment.

According to one embodiment, a method of fabricating a semiconductor device includes forming a plurality of semiconductor chips on semiconductor wafers, each of the semiconductor chips having a test circuit electrically connected to an input pad and an output pad, the input pad having a first pad located on a first principal surface of the semiconductor chip and a second pad located on a second principal surface of the semiconductor wafer opposite to the first principal surface, and electrically connected to the first pad, placing the plurality of semiconductor wafers on a stage of an inspection apparatus, each input pad of the semiconductor chips of the semiconductor wafer brought into contact with each input pad of the semiconductor chips of adjacent semiconductor wafer, bringing each of probing tips of the inspection apparatus into contact with each input pad of the semiconductor chips of an uppermost or lowermost semiconductor wafer in the semiconductor wafers placed on the stage, performing a test on the plurality of semiconductor chips in one batch by using each test circuit of the semiconductor chips and an input signal input from the inspection apparatus so as to obtain result data of the test, and storing the result data in the semiconductor chips.

Hereinafter, embodiments will be described with reference to the drawings.

Portions that appear in various drawings are respectively denoted by identical reference numerals for the description. In addition, proportions of dimensions in the drawings are not restricted to those shown in the drawings.

Embodiments

Semiconductor Wafer Used in Method of Fabricating Semiconductor Device

First, a configuration of a semiconductor wafer used in a method of fabricating a semiconductor device of an embodiment will be described with reference to FIGS. 1 to 3. For the convenience of description, FIG. 2 shows only an input pad 14 and an output pad 15 in a semiconductor chip 11 while omitting the other constituent elements.

<Pads in Semiconductor Chip>

As shown in FIG. 1A, plurality of semiconductor chips are formed on a semiconductor wafer 10. Each of semiconductor chips 11 are disjoined by grinding the backside surface of the semiconductor wafer 10. As shown in FIG. 1B, a memory cell array 12, a test circuit 13, an input pad 14, an output pad 15, and the like are formed in each of the semiconductor chips 11. The test circuit 13 is electrically connected to both the input pad 14 and the output pad 15.

As shown in FIG. 2, the input pad 14 includes a first pad 16 and a second pad 17. The first pad 16 is formed on a first principal surface of the semiconductor chip 11, specifically on the front surface of the semiconductor chip 11, for example. The second pad 17 is formed on a second principal surface of the semiconductor wafer 10, which is opposite to the first principal surface of the semiconductor chip 11. The second principal surface of the semiconductor wafer 10 may be the back surface of the semiconductor wafer 10, for example. The first pad 16 and the second pad 17 are electrically connected to each other through a contact plug 18. The input pad 14 is connected to the output pad 15 through the test circuit 13. Here, the second pad 17 of the input pad 14 is formed below the first pad 16, specifically just beneath the first pad 16, for example.

The first pad 16 is shaped so as to protrude from the front surface of the semiconductor chip 11. The second pad 17 is shaped so as to be recessed in the back surface of the semiconductor wafer 10. That is, the second pad is formed inside of the backside surface of the semiconductor wafer 10. Accordingly, when two semiconductor wafers 10 are stacked one upon the other, the first pads 16 of the lower semiconductor wafer 10 can be fitted into the second pads 17 of the upper semiconductor wafer 10.

The output pad 15 is formed so as to be recessed in the front surface (first principal surface) of the semiconductor chip 11, and is not exposed to the back surface (second principal surface) of the semiconductor wafer 10.

In the embodiment, a technology known as the through-silicon via (TSV) is used to form the first pad 16 of the semiconductor chip 11 and the contact plug 18. In addition, the second pad 17 is formed in the back surface of the semiconductor wafer 10 by dry-etching (e.g., RIE) using a photoresist mask with a desired pattern. After that, a conductive material is filled to complete the process.

<Structure of Semiconductor Chip>

Next, the structure of the semiconductor chip 11 will be described with reference to FIG. 3. As shown in FIG. 3, the semiconductor chip 11 includes the memory cell array 12 and the test circuit 13 that is connected to an external inspection apparatus 40 through the input pad and the output pad.

The memory cell array 12 includes a user region 30 configured to store ordinary data, a ROM fuse region 31 configured to store management data showing the characteristics of the semiconductor chip 11, and a memory register region 32 configured to store result data.

The test circuit 13 includes a data input/output buffer 20, a BIST circuit 21, a control circuit 22, and a comparing circuit 23.

The data input/output buffer 20 inputs and outputs information (commands CMD, addresses ADD and data DAT) exchanged between the semiconductor chip 11 and the inspection apparatus 40. The data input/output buffer 20 is connected to each of the input and the output pads with internal wiring (not illustrated).

The BIST circuit 21 is a test circuit which is built in the semiconductor chip 11 so as to test efficiently the semiconductor chip 11, specifically, the memory cell array 12, for example. The BIST circuit 21 generates plurality of test signals which have wave patterns needed for the testing, on the basis of input signals with a clock waveform input from the inspection apparatus 40 through the data input/output buffer 20. Then, the BIST circuit 21 generates sequentially the plural test signals thus outputting to the control circuit 22.

On the basis of the test signals input from the BIST circuit 21, the control circuit 22 controls a voltage generation circuit (not illustrated) of the memory cell array 12, a column decoder (not illustrated), a page buffer (not illustrated), and the like. The control circuit 22 performs testing on the memory cell array 12 of the semiconductor chip 11, for example. The control circuit 22 tests the memory cell array 12 of the semiconductor chip 11, for example. The control circuit finds how many defective memory cells are in the user region 30 of the memory cell array 12, for example.

The control circuit 22 stores the result data of the testing output to the comparing circuit 23 in the memory register region 32 of the memory cell array 12. The result data refer to data showing the test results read after the testing on the memory cell array 12, for example, on the basis of the test signals output from the BIST circuit 21.

The control circuit 22 loads both the result data (e.g., data on the number of defective memory cells) stored in the memory resister region 32 and allowable range data stored in the ROM fuse region 31 to the comparing circuit 23. The allowable range data show the allowable range to determine whether the result data are adequate or not. An example of such allowable range data is a range below the allowable number of defective memory cells.

The comparing circuit 23 compares the result data with the allowable range data to determine whether the result data are within the allowable range or not. If the comparing circuit 23 determines that the result data are within the allowable range, the control circuit 22 stores acceptable-product data indicating that the product has acceptable quality in the ROM fuse region 31. Conversely, if the comparing circuit 23 determines that the result data are not within the allowable range, the control circuit 22 stores defective-product data indicating that the product has unacceptable quality in the ROM fuse region 31.

[Configuration of Inspection Apparatus Used in Method of fabricating Semiconductor Device]

Next, the configuration of the inspection apparatus and semiconductor wafers used in testing semiconductor devices according to the embodiment will be described with reference to FIG. 4A, 4B, respectively. For convenience of description, each semiconductor chip of a semiconductor wafer 10a shown in FIG. 4A will be referred to as a semiconductor chip 11a, and each semiconductor chip of a semiconductor wafer 10b will be referred to as a semiconductor chip 11b. Corresponding elements in FIGS. 4A and 4B are similarly labeled, such as output pads 15a, 15b, first pads 16a, 16b, second pads 17a, 17b and contact plugs 18a, 18b.

Figure 4A:
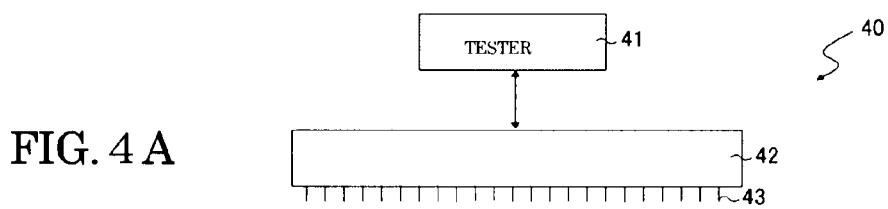
FIG. 4A, 4B are a cross sectional view showing the configuration of an inspection apparatus and semiconductor wafers used in testing semiconductor devices, respectively, according to the embodiment.
Figure 4B:
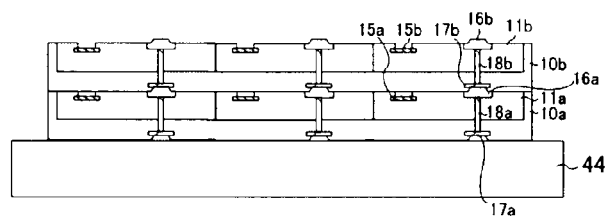

As shown in FIG. 4A, the inspection apparatus 40 includes a tester 41, a probe card 42, probing tips 43 provided to the probe card 42, and a stage 44. As shown in FIG. 4B, semiconductor wafers 10a, 10b are stacked on the stage 44.

The probe card 42 tests the electrical characteristics of each of the semiconductor chips 11a, 11b stacked one upon the other on the stage 44. The probing tips 43 provided to the probe card 42 can come into contact with the input pad formed on each of the semiconductor wafers 10b, for example.

A batch testing is performed on all the semiconductor chips 11a, 11b by bringing the probing tips 43 into contact with the input pads and inputting an input signal with a clock waveform, for example, from the tester 41 to the semiconductor chips 11a, 11b.

[Method of Fabricating Semiconductor Device]

Figure 5:
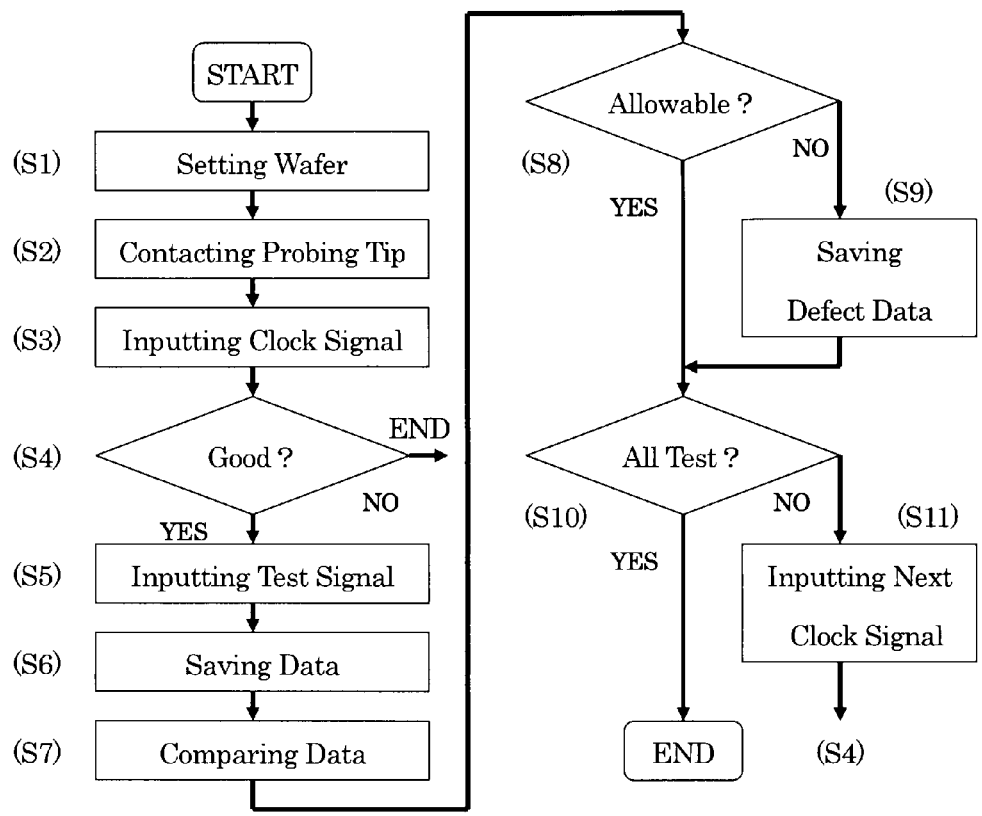
FIG. 5 is a flowchart showing the method of fabricating the semiconductor device of the embodiment.

Next, a method of saving data whether a semiconductor chip has acceptable quality or not, as quality data on the acceptability of a semiconductor chip in the method of fabricating a semiconductor device according to the embodiment will be described with reference to the flowchart as shown in FIG. 5.

<Process of Storing Data on Qualification of Semiconductor Chip>

The process of saving quality data in the ROM fuse region 31 is performed in a chip select ion test to distinguish acceptable semiconductor memory devices from defective devices, for example. A specific procedure will be described below. Note that a case where plural kinds of electrical characteristics are tested will be described.

Note that the data stored in the memory register region 32 in the initial state are assumed to be acceptable-product data.

First, at step S1, the semiconductor wafer 10a is placed on the stage 44 with the principal surface (meaning the same as the principal surface of the semiconductor chip 11a, that is, the surface in which the first pad 16a is formed) of the semiconductor wafer 10a facing upwards as shown in FIG. 4. Then, the semiconductor wafer 10b is placed on the semiconductor wafer 10a with the principal surface of the semiconductor wafer 10b facing upwards. Here, each of first pads 16a protruding from the front surface of the lower semiconductor wafer 10a and the corresponding pad in second pads 17b formed in the back surface of the upper semiconductor wafer 10b are fitted together to become in contact with each other.

At step S2, the probing tips 43 are brought into contact respectively with first pads 16b of the semiconductor chips 11b of the uppermost semiconductor wafer in the semiconductor wafers stacked on the stage 44 (hereinafter, referred to as the uppermost wafer, and being the semiconductor wafer 10b in FIG. 4).

At step S3, an input signal with a clock waveform, for example, is input from the tester 41 through the first pads 16b into the BIST circuits 21 of the semiconductor chips 11b formed on the uppermost wafer 10b. In addition, the input signal with a clock waveform input into the first pads 16b is supplied through contact plugs 18b and the second pads 17b of the uppermost wafer 10b to the semiconductor wafers other than the uppermost wafer 10b, that is, to the first pads 16a of the semiconductor chips 11a of the lower semiconductor wafer 10a, for example. The input signal is input through the first pads 16a into the BIST circuits 21 of the semiconductor chips 11a formed on the lower semiconductor wafer 10a.

Then the BIST circuits 21 of the semiconductor chips 11b, 11a formed on the upper and the lower semiconductor wafers 10b, 10a generate test signals needed for the test and output the test signals to the corresponding control circuits 22 of the semiconductor chips 11a, 11b.

At the following steps, all the semiconductor chips 11a, 11b are operated in the same manner. Accordingly, for the convenience of description, the operation of the semiconductor chip 11 will be described with reference to FIGS. 2, 3, and 5.

At step S4, the control circuit 22 which has received the test signal reads the quality data from the memory register region 32. Since the data stored in the memory register region 32 in the initial state are acceptable-product data, the read data are acceptable-product data (Yes at step S4). Accordingly, on the basis of the test signal, the control circuit 22 controls the page buffer and the like, and inputs the test signal into the user region 30 of the memory cell array 12, for example (step S5). Thus, a control signal to control the testing operation, an input signal to be used in the testing, an address signal to identify the address to be tested, and the like are input into the user region 30 to test the memory cell array 12.

Then at step S6, when the testing on the semiconductor chip 11 is finished, the control circuit 22 loads the result data to the comparing circuit 23 and stores the loaded result data in the memory register region 32 of the memory cell array 12. Here, binary (1 bit) data, for example, are used to distinguish the non-defective product from the defective product.

Then, at step S7, the control circuit 22 loads the allowable range data stored in the ROM fuse region 31 to the comparing circuit 23. The comparing circuit 23 compares the result data with the loaded allowable range data to determine whether the result data are within the allowable range.

When the comparing circuit 23 determines that the result data are within the allowable range (Yes at step S8), the control circuit 22 does not rewrite data stored in the memory resistor region 32. The acceptable-product data are kept unchanged, and the first test is finished.

Conversely, when the comparing circuit 23 determines that the result data are not within the allowable range (No at step S8), the control circuit 22 replace the acceptable-product data that have been stored in the memory resistor region 32 with defective-product data (step S9). Thus, the first test is finished.

When a series of electrical-characteristic tests are performed following the first test, next step are conducted as follows. At step S10, when the control circuit 22 determines that not all the plural tests input from the BIST circuit 21 and performed on the semiconductor chip 11 are finished (No at step S10), a test signal which is different from another test signal input into the memory cell array 12 at step S5 is input from the BIST circuit 21 into the control circuit 22 (step S11).

Next, retuning at step S4, the control circuit 22 received the new test signal reads the quality data from the memory register region 32. When the read data are acceptable-product data (Yes at step S4), the control circuits 22 controls based on the test signal and inputs the test signal into the memory cell array 12 (step S5).

Conversely, when the read data are defective-product data (No at step S4), the test is finished.

Then, post steps from the steps S4 are repeated until all the tests are finished (Yes at step S10). When all the tests are finished, no more tests will be performed.

<Process of Reading Data on Qualification of Semiconductor Chip>

Next, a method of reading the data on the acceptability of the semiconductor chip in the method of fabricating the semiconductor device of the embodiment will be described.

After the process described above of saving the data on the acceptability of a semiconductor chip, the quality data stored in the memory register region 32 of each semiconductor chip 11 are read by an inspection apparatus which is different from the inspection apparatus 40 used in the process described above, for example. The different inspection apparatus carries out to read the quality data, and includes a probe tips.

Specifically, the probe tips are brought into contact with the output pads 15 of the semiconductor chips 11 of the semiconductor wafer 10 as shown in FIGS. 2 and 3, and then using the control circuit 22, the quality data stored in the ROM fuse regions 31 of the memory cell arrays 12 are read to the inspection apparatus through the output pads 15. Using the quality data thus read, whether each semiconductor chip 11 is an acceptable product or a defective product is determined.

Effects of Embodiment

The embodiment described thus far can provide a method of fabricating a semiconductor device capable of shortening the time to test semiconductor chips formed on semiconductor wafers. The effects will be described specifically below.

In the embodiment, the input pad 14 of the test circuit 13 built in each of the semiconductor chips 11 includes both the first pad 16 formed in the front surface of the semiconductor chip 11 and the second pad 17 formed in the back surface of the semiconductor wafer 10. The first pad 16 and the second pad 17 are electrically connected to each other through the contact plug 18. When the plurality of the semiconductor wafers 10 are stacked one upon another, the first pads 16a of the lower semiconductor wafer 10a and the second pads 17b of the upper semiconductor wafer 10b are fitted together to become in contact with each other.

Accordingly, a batch testing to determine whether the semiconductor chips 11a, 11b are acceptable products or defective products is made possible by stacking the plurality of the semiconductor wafers 10a, 10b one upon another. Consequently, the embodiment can significantly shorten the testing time for each semiconductor chip in comparison to a case where a batch testing is performed on the semiconductor chips formed on a single semiconductor wafer.

In addition, in the embodiment, the second pad 17 of the input pad 14 of the test circuit 13 is formed below the first pad 16. Accordingly, the plurality of the semiconductor wafers 10a, 10b are stacked one upon another without a lateral-direction shift. Hence, the size of the stage 44 of the inspection apparatus 40, where the plurality of the semiconductor wafers 10a, 10b are placed is approximately the same as the size of each of the semiconductor wafers 10a, 10b. Thus, the inspection apparatus can be prevented from becoming larger in size.

In addition, in the embodiment, the quality data are stored in the memory register region 32 of each of the semiconductor chips 11a, 11b after the test is finished. Accordingly, the process where the semiconductor chips 11a, 11b are tested can be separated from the process where quality data are read. In other words, while some of the semiconductor chips 11a, 11b of the plurality of the semiconductor wafers 10a, 10b are being tested, the quality data can be read for other already tested chips of the semiconductor wafers 10a, 10b.

Accordingly, the two processes can be carried out independent of each other. The testing time for each semiconductor chip can be shortened furthermore in comparison to a method where the testing is performed to determine whether a semiconductor chip is an acceptable product or a defective product in a single process.

First Modification

At step S2 in the embodiment, the probing tips 43 are brought into contact with the corresponding first pads 16b of the semiconductor chips 11b formed in the uppermost wafer 10b. As a first modification, probing tips 43 may be brought into contact with second pads 17a formed in the lowermost one (hereinafter, referred to as the lowermost wafer and being the semiconductor wafer 10a in FIG. 4) of semiconductor wafers 10 stacked one upon another on a stage 44. In this case, a groove (not illustrated) penetrating the stage 44 is formed so as to allow the probing tips 43 to come in contact with the corresponding second pads 17a.

[Effects of First Modification]

In the first modification of the embodiment, the probing tips 43 are brought into contact with the second pads 17a formed in the backside surface of the lowermost wafer 10a. Even when misalignment between the probing tips 43 and the second pads 17a occurs to make the probing tips 43 brought into contact with portions of the semiconductor wafer 10a which are different from the second pads 17a, semiconductor chips 11a can be prevented from being damaged or broken because no semiconductor chips 11a are formed in the back surface of the semiconductor wafer 10a.

Second Modification

At step S1 in the method of fabricating a semiconductor device of the embodiment, the plurality of the semiconductor wafers 10a, 10b are stacked one upon another on the stage 44 as shown in FIG. 4. In a second modification, plurality of the semiconductor wafers may be stacked on the stage 44 while each of the semiconductor wafers superimposes perpendicular to the plane of the stage 44.

In this case, at step S2, the probing tips 43 are brought into contact with either the second pads 17 of the leftmost wafer in the semiconductor wafers placed on the stage 44 or the first pads 16 of the rightmost wafer in place of either the uppermost wafer or the lowermost wafer.

Also in this case, the same effects as those obtainable in the embodiment can be obtained.

Third Modification

Figure 6:
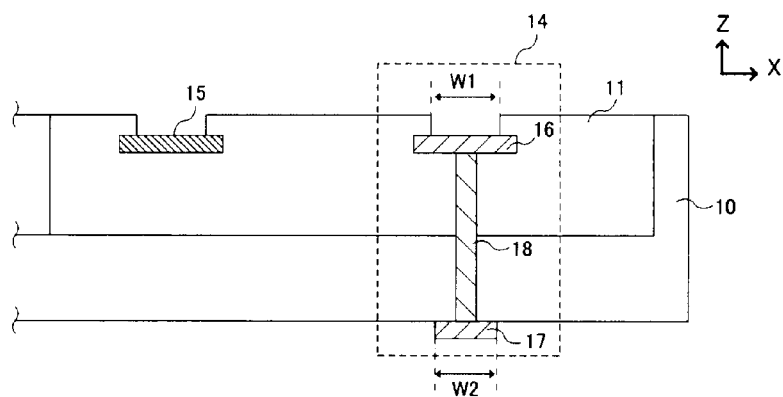
FIG. 6 is a sectional view showing a configuration of a semiconductor chip according to a third modification of the embodiment.

In addition, as modifications of the shapes of the first pad 16 and the second pad 17 of the embodiment, a first pad 16 may be recessed in the front surface of the semiconductor chip 11 and a second pad 17 may protrude from the back surface of the semiconductor wafer 10 as shown in FIG. 6. Note that to allow the first pad 16 and the second pad 17 to be fitted together, the width W1 of the exposed portion of the first pad 16 is longer than the width W2 of the second pad measured in the X-direction. The first pad 16 and the second pad 17 may have any shapes as long as the first pad 16 and the second pad 17 can be fitted together. In addition, a protruding shape may have an area decreasing gradually from the bottom surface towards the front surface. A conical shape is an example of such shapes, and a conical pad may be placed to be stuck in the bottom surface of a recessed shape. Thus the pads can come into better contact with each other. In the above-described case, the protruding pad has such a shape that the protruding pad can be fitted to the recessed pad.

Also in this case, the effects that are obtainable in the embodiment can be obtained.

Fourth Modification

In the embodiment, the test result of the memory cell array 12 is stored in the memory register region 32 of the memory cell array 12. Alternatively, a memory resistor may be formed in a test circuit 13 to store the test result. In the embodiment, the allowable range data are stored in a ROM fuse region 31. However, the allowable range data may be stored in the memory resistor.

Also in this case, the effects that are obtainable in the embodiment can be obtained.

Fifth Modification

In this embodiment, the output pad 15 is used to load the quality data to the inspection apparatus 40. An output pad 15 may also be used when ordinary data are written to or read from the user region 30, for example, of the semiconductor device fabricated in the embodiment, or when information is input or output into or from the user region 30. That is, the output pad 15 may be used as an input/output pad.

In this embodiment, the semiconductor chips 11 are formed by grinding the back surface of the semiconductor wafer 10. In some cases, semiconductor chips 11 are formed without grinding the back surface of a semiconductor wafer 10. In such cases, the principal surface of the semiconductor wafer 10 is the back surface which faces the principal surfaces of the semiconductor chips 11.

What is claimed is:

1. A method of fabricating a semiconductor device, comprising:
   forming a plurality of semiconductor chips on semiconductor wafers, each of the semiconductor chips having a test circuit electrically connected to an input pad and an output pad, the input pad having a first pad located on a first principal surface of the semiconductor chip and a second pad located on a second principal surface of the semiconductor wafer opposite to the first principal surface, and electrically connected to the first pad;
   placing the plurality of semiconductor wafers on a stage of an inspection apparatus, each input pad of the semiconductor chips of the semiconductor wafer brought into contact with each input pad of the semiconductor chips of adjacent semiconductor wafer;
   bringing each of probing tips of the inspection apparatus into contact with each input pad of the semiconductor chips of an uppermost or lowermost semiconductor wafer in the semiconductor wafers placed on the stage;

performing a test on the plurality of semiconductor chips in one batch by using each test circuit of the semiconductor chips and an input signal input from the inspection apparatus so as to obtain result data of the test; and storing the result data in the semiconductor chips.

2. The method of claim 1, wherein one of the first pad and the second pad of each of the semiconductor chips is arranged as a protruding portion on the corresponding principle surface of the first principal surface and the second principal surface of the semiconductor chip, the other of the first pad and the second pad is arranged at a bottom of an opening portion in the other corresponding principal surface of the semiconductor chip, and the first pads of the semiconductor wafers and the second pads of adjacent semiconductor wafer are fitted together and brought into contact with each other in placing the plurality of semiconductor wafers on the stage of the inspection apparatus.

3. The method of claim 1, wherein a plurality of types of tests are sequentially performed on the semiconductor chips in testing, and the result data stored in the semiconductor chips are read, and the semiconductor chips storing as the result data acceptable product data are subjected to a next test.

4. The method of claim 1, wherein each of semiconductor wafers is placed in a direction perpendicular to a plane of the stage in placing semiconductor wafers.

5. The method of claim 1, wherein the result data are stored in the test circuits.

6. The method of claim 1, wherein the output pads are used to output and input ordinary data in the semiconductor chips.

7. The method of claim 1, wherein the result data are obtained from one of the semiconductor chips while the result data are stored from other of the semiconductor chips in performing the test on the semiconductor chips in one batch to obtain the result data and storing the result data in the semiconductor chip.

8. The method of claim 2, wherein the width of a top surface of the pad as the protruding portion is smaller the width of a bottom surface of the opening portion above the pad in the semiconductor chip.

9. The method of claim 8, wherein both of the pad as the protruding portion and the opening portion above the pad have a cylindrical shape or a prism shape.

10. The method of claim 8, wherein the area of the pad as the protruding portion is arranged as smaller from a bottom surface to a top surface, and the area of pad in the opening portion above the pad is arranged as larger from a bottom surface to a top surface.

11. The method of claim 10, wherein the pad as the protruding portion has a conical shape tapered from the bottom surface to the top surface, and the opening portion above the pad has a conical shape tapered from the top surface to the bottom surface.

12. The method of claim 11, wherein the pad as the protruding portion having the conical shape is stuck into the surface of the pad in the opening portion, so that both of the pads are brought into contact each other.

13. A method of fabricating a semiconductor device, comprising:

forming a plurality of semiconductor chips on semiconductor wafers, each of the semiconductor chips having a test circuit electrically connected to an input pad and an output pad, the input pad having a first pad located on a first principal surface of the semiconductor chip and a second pad located on a second principal surface of the semiconductor wafer opposite to the first principal surface, and electrically connected to the first pad;

placing the plurality of semiconductor wafers on a stage of an inspection apparatus, each input pad of the semiconductor chips of the semiconductor wafer brought electrically into contact with each input pad of the semiconductor chips of adjacent semiconductor wafer;

bringing each of probing tips of the inspection apparatus into contact with each input pad of the semiconductor chips of an uppermost or lowermost semiconductor wafer in the semiconductor wafers placed on the stage; and performing a test on the plurality of semiconductor chips in one batch by using each test circuit of the semiconductor chips and an input signal input from the inspection apparatus so as to obtain result data of the test.

14. The method of claim 13, further comprising:

storing the result data in the semiconductor chips.

* * * * *